US010147831B2

(12) United States Patent
Ishii

(10) Patent No.: US 10,147,831 B2
(45) Date of Patent: Dec. 4, 2018

(54) SOLAR MODULE AND MANUFACTURING METHOD THEREFOR

(71) Applicant: Sanyo Electric Co., Ltd., Moriguchi, Osaka (JP)

(72) Inventor: Yosuke Ishii, Izumiotsu (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 592 days.

(21) Appl. No.: 14/186,318

(22) Filed: Feb. 21, 2014

(65) Prior Publication Data
US 2014/0166068 A1    Jun. 19, 2014

Related U.S. Application Data

(63) Continuation of application No. PCT/JP2012/062143, filed on May 11, 2012.

(30) Foreign Application Priority Data

Aug. 31, 2011 (JP) .................. 2011-189210

(51) Int. Cl.
*H01L 31/05* (2014.01)
*H01R 43/26* (2006.01)

(52) U.S. Cl.
CPC ......... *H01L 31/0516* (2013.01); *H01R 43/26* (2013.01); *Y02E 10/50* (2013.01); *Y10T 29/49117* (2015.01)

(58) Field of Classification Search
CPC ......... H01L 31/022441; H01L 31/0504; H01L 31/0508; H01L 31/0516
See application file for complete search history.

(56) References Cited

U.S. PATENT DOCUMENTS

| | | | | |
|---|---|---|---|---|
| 3,094,439 A | * | 6/1963 | Mann ............... | H01L 31/022433 136/244 |
| 4,331,492 A | * | 5/1982 | Dominguez .......... | H01L 31/048 136/251 |
| 5,897,715 A | * | 4/1999 | Ward .................... | H01L 31/056 136/244 |
| 2011/0041910 A1 | * | 2/2011 | Shimomura .... | H01L 31/022441 136/256 |
| 2011/0056545 A1 | * | 3/2011 | Ji ...................... | H01L 31/02167 136/255 |

FOREIGN PATENT DOCUMENTS

JP           2009266848 A  *  11/2009

* cited by examiner

*Primary Examiner* — Sadie White
(74) *Attorney, Agent, or Firm* — Metrolexis Law Group, PLLC

(57) ABSTRACT

Provided is a solar module having improved photoelectric conversion efficiency and a method for producing this solar module. The wiring (32) has a first linear portion (32a) and a second linear portion (32b). The first linear portion (32a) is arranged at least partially on a finger portion (21a) of a first electrode (21). The first linear portion (32a) is connected electrically to the finger portion (21a) of the first electrode (21). The second linear portion (32b) is arranged at least partially on a finger portion (22a) of a second electrode (22). The second linear portion (32b) is connected electrically to the finger portion (22a) of the second electrode (22). Either the first linear portion (32a) or the second linear portion (32b) is narrower than the other.

9 Claims, 2 Drawing Sheets

SOLAR MODULE AND MANUFACTURING METHOD THEREFOR

CROSS-REFERENCE TO RELATED APPLICATIONS

This is a continuation of International Application PCT/JP2012/062143, with an international filing date of May 11, 2012, filed by applicant, the disclosure of which is hereby incorporated by reference in its entirety.

FIELD OF THE INVENTION

The present invention relates to a solar module and to a manufacturing method for a solar module.

BACKGROUND

Solar modules have attracted attention in recent years as an energy source with a low environmental impact. A solar module, as described in Patent Document 1, includes a plurality of solar cells connected electrically via wiring members.

PRIOR ART DOCUMENTS

Patent Documents

Patent Document 1: Laid-Open Patent Publication No. 2009-266848

SUMMARY

Problem Solved by the Invention

In a back contact solar cell having both a first electrode and a second electrode provided on the back surface on the reverse side from the light-receiving surface, both the first electrode and the second electrode have a plurality of finger portions. The finger portions of the first electrode and the finger portions of the second electrode are interdigitated in the direction orthogonal to the direction in which the finger portions extend. Therefore, when one side of a wiring member is connected to the finger portions of the first electrode of one of two adjacent solar cells, the solar cell and wiring member have to be aligned with great precision when the finger portions of the second electrode of the other solar cell are connected. When the alignment is poor, the photoelectric conversion efficiency may decline.

It is an object of the present invention to provide a solar module and a manufacturing method for a solar module having improved photoelectric conversion efficiency.

Means of Solving the Problem

The solar module of the present invention is provided with solar cells, wiring members and adhesive layers. Each solar cell has a photoelectric conversion unit, a first electrode, and a second electrode. The first electrode and the second electrode are arranged on one main surface of the photoelectric conversion unit. A wiring member electrically connects the first electrode of one of two adjacent solar cells to the second electrode of the other solar cell. The wiring member and the solar cells are bonded via an adhesive layer. The wiring member has an insulating substrate and wiring. The wiring is provided on the insulating substrate. The first electrode and the second electrode each have a plurality of finger portions. The wiring has a first linear portion and a second linear portion. The first linear portion is arranged at least partially on the finger portions of the first electrode. The first linear portion is connected electrically to the finger portions of the first electrode. The second linear portion is arranged at least partially on the finger portions of the second electrode. The second linear portion is connected electrically to the finger portions of the second electrode. Either the first linear portion or the second linear portion has a width that is narrower than the other.

The present invention is also a method for manufacturing a solar module comprising the steps of: preparing a plurality of solar cells each including a photoelectric conversion unit and a first electrode and a second electrode arranged on one main surface of the photoelectric conversion unit and having a plurality of finger portions; preparing a wiring member including an insulating substrate and a wiring arranged on the insulating substrate having a first linear portion and a second linear portion, wherein one of the first linear portion and the second linear portion has a narrower width than the other; and electrically connecting the solar cells and the wiring member, at least some of the first linear portion of the wiring member being positioned on a finger portion of the first electrode of one solar cell, and at least some of the second linear portion of the wiring member being positioned on a finger portion of the second electrode of the other solar cell.

Effect of the Invention

The present invention is able to provide a solar module and a manufacturing method for a solar module having improved photoelectric conversion efficiency.

DETAILED DESCRIPTION

Figure 1:
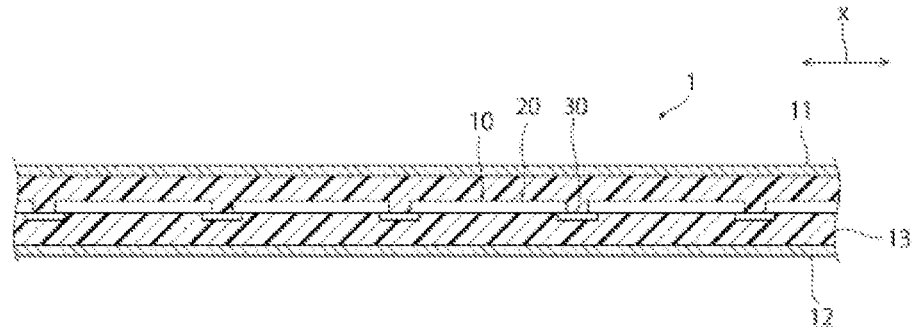
FIG. 1 is a simplified cross-sectional view of a solar module according to an embodiment of the present invention.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

Solar Module 1

As shown in FIG. 1, a solar cell string 10 is provided in the solar module 1. The solar cell string 10 is arranged between a first protecting member 11 positioned on the light-receiving surface side, and a second protecting member 12 positioned on the back surface side. A bonding layer 13 is provided between the first protecting member 11 and the second protecting member 12. The solar cell string 10 is sealed by the bonding layer 13.

The first protecting member 11 can be composed of a glass substrate or a resin substrate. The second protecting member 12 can be composed of a resin sheet, resin sheets including interposed metal foil, a glass substrate, or a resin substrate. The bonding layer 13 can be composed of a resin such as an ethylene/vinyl acetate (EVA) copolymer, polyvinyl butyral (PVB), polyethylene (PE), or polyurethane (PU).

The solar cell string 10 includes a plurality of solar cells 20 arranged in a first direction (the x-direction). The solar cells 20 are connected electrically by wiring members 30.

Figure 2:
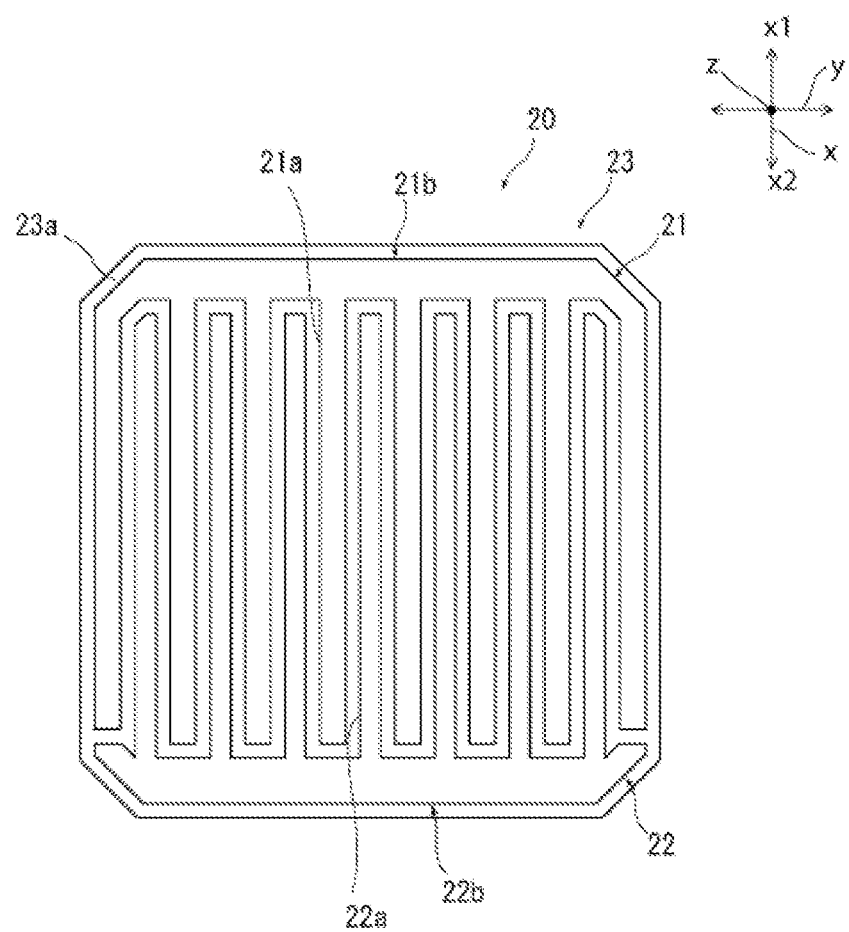
FIG. 2 is a simplified back view of a solar cell according to an embodiment of the present invention.

As shown in FIG. 2, each of the solar cells 20 has a photoelectric conversion unit 23. The photoelectric conversion unit 23 collects carriers such as holes or electrons when exposed to light.

The photoelectric conversion unit 23 has a p-type surface and an n-type surface on the same main surface. The photoelectric conversion unit 23 may have a semiconductor substrate having one type of conductivity, a first semiconductor layer having the other type of conductivity arranged at least partially on the one main surface of the semiconductor substrate, and a second semiconductor layer having the one type of conductivity arranged at least partially on the semiconductor substrate where the first semiconductor layer is not arranged. In this case, the surface of either the first or second semiconductor layer is the p-type surface, and the other surface is the n-type surface. A substantially intrinsic i-type semiconductor layer may be arranged between the semiconductor substrate and both the first and second semiconductor layers at a thickness that does not substantially contribute to the generation of electricity, such as from several Å to 250 Å.

The photoelectric conversion unit 23 may be a semiconductor substrate having both a p-type dopant diffusion region and an n-type dopant diffusion region arranged so as to be exposed on one main surface.

The first electrode 21 and the second electrode 22 are arranged on one main surface 23a of the photoelectric conversion unit 23. More specifically, the first electrode 21 is arranged on either the p-type surface or the n-type surface, and the second electrode 22 is arranged on the other surface.

Both the first electrode 21 and the second electrode 22 are comb-shaped. Both the first electrode 21 and the second electrode 22 have a plurality of finger portions 21a, 22a, and a busbar portion 21b, 22b. The finger portions 21a, 22a extend in the first direction (the x-direction). The finger portions 21a, 22a are interdigitated in a second direction (the y-direction) orthogonal to the first direction (the x-direction).

The finger portions 21a are connected electrically to the busbar portion 21b. The busbar portion 21b is arranged on one side of the finger portions 21a in the x-direction. The busbar portion 21b is provided from one end to the other in the y-direction on the one side of the solar cell 20 in the x-direction.

The finger portions 22a are connected electrically to the busbar portion 22b. The busbar portion 22b is arranged on the other side of the finger portions 22a in the x-direction. The busbar portion 22b is provided from one end to the other in the y-direction on the other side of the solar cell 20 in the x-direction.

The solar cells 20 are connected electrically by a wiring member 30. More specifically, the first electrode 21 of one of two solar cells 20 adjacent to each other in the first direction (the x-direction) is connected electrically to the second electrode 22 of the other solar cell 20 via a wiring member 30.

Figure 4:
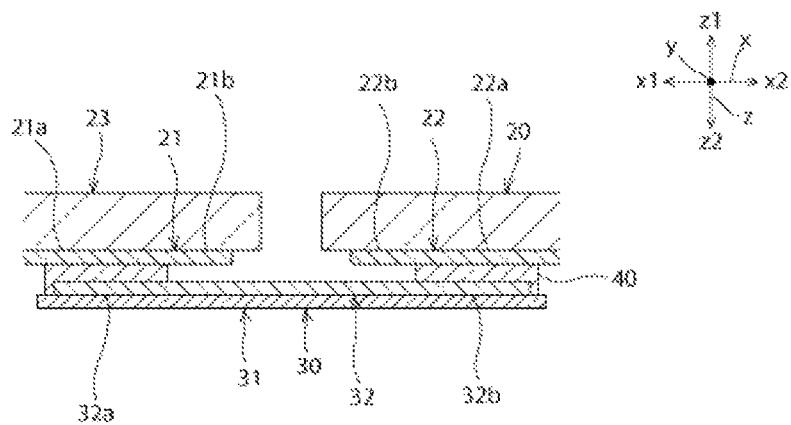
FIG. 4 is a simplified cross-sectional view from line IV-IV in FIG. 3.

The wiring member 30 and the solar cells 20 are bonded via the adhesive layer 40 shown in FIG. 4. The adhesive layer 40 can be composed of a metal such as solder or a cured resin adhesive. The adhesive layer 40 is preferably composed of a cured resin adhesive and conductive particles dispersed throughout the cured resin.

The wiring member 30 has an insulating substrate 31 and wiring 32 provided on the insulating substrate 31. The wiring 32 electrically connects the first electrode 21 of one of two solar cells 20 adjacent to each other in the first direction (the x-direction) to the second electrode 22 of the other solar cell 20.

In the example explained herein, the wiring 32 is provided on the main surface of the insulating substrate 31 that is on the same side as the solar cell 20. A portion of the wiring 32 may be provided inside the insulating substrate 31.

The insulating substrate 31 can be composed of an insulating material such as glass or a ceramic. The insulating substrate 31 may have flexible properties. In the present invention, "substrate" includes both "sheet" and "film".

The wiring 32 can be composed of a metal such as Cu, Al or Ag, or an alloy including at least one of these metals.

The wiring 32 has a first linear portion 32a and a second linear portion 32b. The first linear portion 32a and the second linear portion 32b extend in the first direction (the x-direction), which is the direction in which the first finger portions 21a and the second finger portions 22a also extend.

At least some of the first linear portion 32a is arranged on the finger portions 21a of the first electrode 21 in one solar cell 20 of two solar cells 20 arranged adjacent to each other in the first direction (the x-direction). The first linear portion 32a is connected directly to the finger portions 21a of the first electrode 21 and not via the busbar portion 21b. The first linear portion 32a may be connected electrically to the finger portions 21a of the first electrode 21 via the busbar portion 21b.

At least some of the second linear portion 32b is arranged on the finger portions 22a of the second electrode 22 in the other solar cell 20 of two solar cells 20 arranged adjacent to each other in the first direction (the x-direction). The second linear portion 32b is connected directly to the finger portions 22a of the second electrode 22 and not via the busbar portion 22b. The second linear portion 32b may be connected electrically to the finger portions 22a of the second electrode 22 via the busbar portion 22b.

Figure 3:
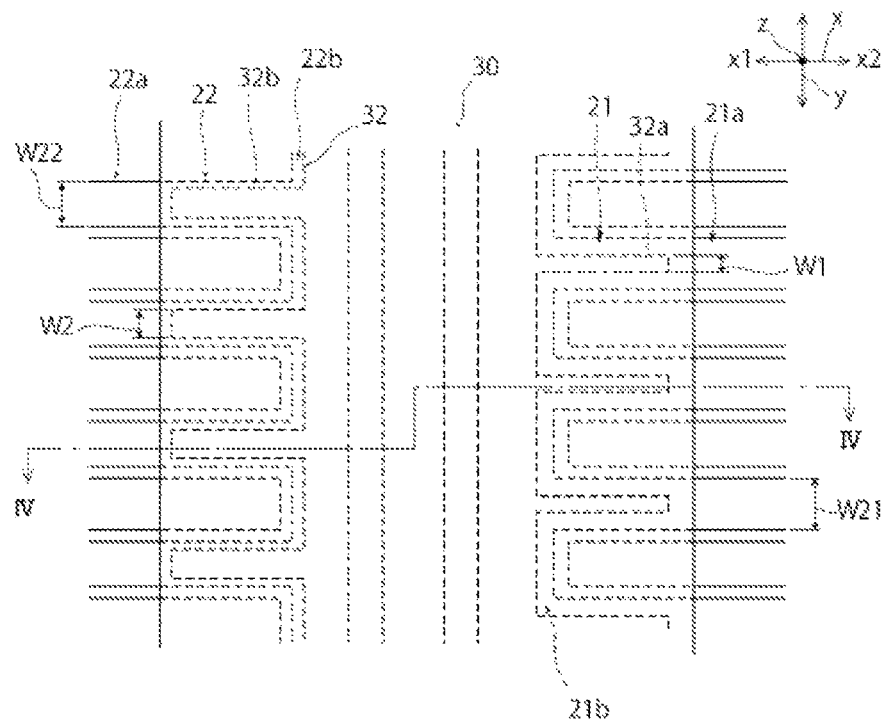
FIG. 3 is a simplified back view of a solar cell string according to an embodiment of the present invention.

As shown in FIG. 3, the width W1 of the first linear portion 32a of the wiring 32 in the second direction (the y-direction) is narrower than the width W2 of the second linear portion 32b in the second direction (the y-direction).

When the ratio (W1/W2) of the width W1 of the first linear portion 32a to the width W2 of the second linear portion 32b is too small, the electrical resistance of the narrow first linear portion 32a is sometimes too high. When the ratio of the width of the first linear portion 32a to the width of the second linear portion 32b is too large, the second linear portion 32b is more likely to come into contact with the finger portions 21a. Therefore, the width ratio W1/W2 is preferably from 1/2 to 3/4.

The ratio (W1/W21) of the width W1 of the first linear portion 32a to the width W21 of the finger portions 21a beneath the first linear portion 32a in the second direction (the y-direction) is preferably from 1/4 to 1/2, and more preferably from 1/4 to 1/3.

The ratio (W2/W22) of the width W2 of the second linear portion 32b to the width W22 of the finger portions 22a in the second direction (the y-direction) is preferably from 1/4 to 2/3, and more preferably from 1/3 to 1/2.

The width W21 of finger portions 21a is preferably wider than the width W22 of finger portions 22a. In this case, the first electrode 21 including the wider finger portions 21a is preferably the electrode used to collect the minority carriers, and the second electrode 22 with the narrower finger portions 22a is preferably the electrode used to collect the majority carriers. This reduces the distance the minority carriers have to travel in order to be collected by the finger portions 21a. Because recombination of the minority carriers can be suppressed in this way, the photoelectric conversion efficiency of the solar module 1 is improved.

From the standpoint of realizing even better photoelectric conversion efficiency, the ratio (W22/W21) of the width W22 of finger portions 22a to the width W21 of finger portions 21a is preferably from 2/3 to 7/8.

Manufacturing Method for Solar Module 1

The following is an explanation of an example of a method for manufacturing this solar module 1.

First, the solar cells 20 and wiring members 30 are prepared.

Next, two solar cells 20 and a wiring member 30 are arranged so that at least some of the second linear portion 32b of the wiring member 30 is positioned on the finger portions 22a of the second electrode 22 of one of the solar cells 20, and at least some of the first linear portion 32a of the wiring member 30 is positioned on the finger portions 21a of the first electrode 21 of the other solar cell 20. When the solar cells 20 and the wiring member 30 are bonded in this state of alignment using an adhesive, the finger portions 21a of the first electrode 21 of one of the solar cells 20 are connected electrically to the finger portions 22a of the second electrode 22 of the other solar cell 20. A solar cell string 10 is created after this bonding operation has been performed at least one more time.

Next, the solar cell string 10 is sealed between a first protecting member 11 and a second protecting member 12 via bonding layers 13. More specifically, a resin sheet such as an EVA sheet constituting the bonding layer 13 is placed on top of the second protecting member 12. The solar cell string 10 is placed on this resin sheet, a resin sheet such as an EVA sheet constituting a bonding layer 13 is placed on this, and the first protecting member 11 is placed on top. This is laminated in a reduced-pressure atmosphere to complete the solar module 1.

In the present embodiment, as explained above, the width W1 of the first linear portion 32a is narrower than the width W2 of the second linear portion 32b. This can inhibit contact between the first linear portion 32a and the finger portions 22a even when the alignment precision between the first linear portion 32a and the finger portions 21a is poor. As a result, improved photoelectric conversion efficiency can be realized.

When the width W22 of the finger portions 22a is narrower than the width W21 of the finger portions 21a, the wider second linear portion 32b is connected to the narrower finger portions 22a, and the narrower first linear portion 31a is connected to the wider finger portions 21a. In this case, when the wider second linear portion 32b is connected to the narrower finger portions 22a, and the narrower first linear portion 32a is connected to the wider finger portions 21a, precision alignment is not required. This makes it easier to connect the wiring 32 to the finger portions 21a, 22a.

Because it is easier to connect solar cells 20 using a wiring member 30, it is also easier to manufacture a solar module 1.

In addition, precision alignment is not required for the solar cells 20 and the wiring member 30 in order restrict contact between the first linear portion 32a and the finger portions 22a. This makes it easier to connect solar cells 20 using a wiring member 30. Therefore, a solar module 1 can be manufactured more easily. In other words, a solar module 1 is easier to manufacture.

From the standpoint of making solar modules 1 easier to manufacture and realizing better photoelectric conversion efficiency, the ratio (W1/W2) of the width W1 of the first linear portion 32a to the width W2 of the second linear portion 32b is preferably 3/4 or less, and more preferably 2/3 or less. When W1/W2 is too small, the output of the solar module 1 is reduced. Therefore, W1/W2 is preferably 1/3 or more, and more preferably 1/2 or more.

In the present invention, the first finger portions 21a beneath the narrower first linear portion 32a are wider than the second finger portions 22a. As a result, the ratio (W1/W21) of the width W1 of the first linear portions 32a to the width W21 of the first finger portions 21a can be reduced even further. Therefore, there is even less demand for alignment precision between the solar cells 20 and the wiring member 30 to reduce contact between the first linear portion 32a and the finger portions 22a. This makes a solar module 1 even easier to manufacture.

From the standpoint of making a solar module 1 easier to manufacture, W1/W21 is preferably 1/2 or less, and more preferably 1/3 or less. W2/W22 is preferably 2/3 or less, and more preferably 1/2 or less. When W1/W21 and W2/W22 are too small, the electrical resistance of the first linear portion 32a and the second linear portion 32b may be too high. Therefore, both W1/W21 and W2/W22 are preferably 1/4 or more, and more preferably 1/3 or more.

The present invention includes many embodiments not described herein. For example, the width of the second linear portion may be narrower than the width of the first linear portion.

At least some of the first and second linear portions may be narrower. The narrower linear portions may be arranged on the narrower finger portions of the first and second electrodes, and the wider ones may be arranged on the wider finger portions.

The length of the narrower first and second linear portions may be greater than the length of the wider first and second linear portions. This can reduce the contact resistance between the wider linear portions and the first electrode or the second electrode.

The wiring member may be aligned with and connected electrically to one of the two solar cells, and then the wiring member connected electrically to the solar cell may be aligned with and connected electrically to the other solar cell.

The present invention includes many other embodiments not described herein. Therefore, the technical scope of the present invention is defined solely by the items of the invention specified in the claims pertinent to the above explanation.

KEY TO THE DRAWINGS

1: Solar module
20: Solar cell
21: 1st electrode
22: 2nd electrode 21a, 22a: Finger portions
23: Photoelectric conversion unit
23a: Main surface of photoelectric conversion unit
30: Wiring member
31: Insulating substrate
32: Wiring
32a: 1st linear portion
32b: 2nd linear portion
40: Adhesive layer

What is claimed is:

1. A solar module comprising:
a plurality of solar cells each having a photoelectric conversion unit, wherein the photoelectric conversion unit of each of the plurality of solar cells comprises: a light-receiving surface; and a back surface comprising a p-type surface area and a n-type surface area; and a first electrode on one of the p-type and n-type surface areas of the back surface and a second electrode arranged on the other of the p-type and n-type surface areas of the back surface of the photoelectric conversion unit, the plurality of solar cells including a first solar cell and a second solar cell adjacent each other in a first direction;
a wiring member electrically connecting the first electrode on the back surface of the photoelectric conversion unit of the first solar cell to the second electrode on the back surface of the photoelectric conversion unit of the second solar cell; and
an adhesive layer bonding the wiring member and the first and second solar cells;
the wiring member having an insulating substrate and wiring provided on the insulating substrate;
the first electrode and the second electrode on the back surface of the photoelectric conversion unit of the first solar cell each having a plurality of finger portions each of which extending in the first direction and the first electrode and the second electrode on the back surface of the photoelectric conversion unit of the second solar cell each having a plurality of finger portions each of which extending in the first direction;
the wiring having a plurality of first linear portions arranged at least partially on a finger portion of the first electrode on the back surface of the photoelectric conversion unit of the first solar cell and connected electrically to the finger portion of the first electrode on the back surface of the photoelectric conversion unit of the first solar cell, and a plurality of second linear portions arranged at least partially on a finger portion of the second electrode on the back surface of the photoelectric conversion unit of the second solar cell and connected electrically to the finger portion of the second electrode on the back surface of the photoelectric conversion unit of the second solar cell;
the plurality of first linear portions each having a first width in a second direction orthogonal to the first direction and the plurality of second linear portions each having a second width in the second direction, and
the first width of each first linear portion being smaller than the second width of each second linear portion, wherein a width of each of the finger portions of the first electrode, on which the first linear portions of the wiring having the first width are provided, is larger than a width of each of the finger portions of the second electrode, on which the second linear portions of the wiring having the second width are provided.

2. The solar module according to claim 1, wherein a ratio of the first width of each first linear portion to the second width of each second linear portion is from 1/3 to 3/4.

3. The solar module according to claim 1, wherein the first electrode collects minority carriers, and the second electrode collects majority carriers.

4. The solar module according to claim 1, wherein a ratio of the first width of each first linear portion to the width of each of the finger portions of the first electrode is from 1/4 to 1/3.

5. The solar module according to claim 1, wherein a ratio of the second width of each second linear portion to the width of each of the finger portions of the second electrode is from 1/3 to 1/2.

6. The solar module according to claim 1, wherein the first electrode of the first solar cell has a first busbar portion connected to the finger portions of the first electrode of the first solar cell, and
the second electrode of the second solar cell has a second busbar portion connected to the finger portions of the second electrode of the second solar cell.

7. The solar module according to claim 1, wherein
the width, in the second direction, of each of the finger portions of the first electrode and the width, in the second direction, of each of the finger portions of the second electrode are constant along the first direction.

8. The solar module according to claim 1, wherein
the first width, in the second direction, of each first linear portion of the wiring and the second width, in the second direction, of each second linear portion of the wiring are constant along the first direction.

9. The solar module according to claim 1, wherein
the first electrode is not in direct-contact with the second electrode on the back surface of the photoelectric conversion unit of each of the plurality of solar cells.

* * * * *